US008261166B2

(12) United States Patent
Ulriksson

(10) Patent No.: US 8,261,166 B2
(45) Date of Patent: Sep. 4, 2012

(54) NODE PROCESSOR FOR USE WITH LOW DENSITY PARITY CHECK DECODER USING MULTIPLE VARIABLE NODE DEGREE DISTRIBUTION CODES

(75) Inventor: Bengt A. Ulriksson, Milford, MA (US)

(73) Assignee: Seagate Technology LLC, Cupertino, CA (US)

( * ) Notice: Subject to any disclaimer, the term of this patent is extended or adjusted under 35 U.S.C. 154(b) by 962 days.

(21) Appl. No.: 12/212,070

(22) Filed: Sep. 17, 2008

(65) Prior Publication Data

US 2010/0070818 A1 Mar. 18, 2010

(51) Int. Cl.
*G06F 11/00* (2006.01)

(52) U.S. Cl. ........................................................ 714/786

(58) Field of Classification Search .................. 714/752, 714/758, 801, 804, 786, 792, 794
See application file for complete search history.

(56) References Cited

U.S. PATENT DOCUMENTS

| | | | | |
|---|---|---|---|---|
| 6,957,375 | B2 | 10/2005 | Richardson | |
| 7,237,171 | B2 | 6/2007 | Richardson | |
| 7,318,186 | B2 | 1/2008 | Yokokawa et al. | |
| 7,353,444 | B2 | 4/2008 | Owsley et al. | |
| 7,373,585 | B2 | 5/2008 | Yedidia et al. | |
| 7,395,490 | B2 | 7/2008 | Richardson et al. | |
| 7,398,455 | B2 | 7/2008 | Eroz et al. | |
| 7,661,055 | B2 * | 2/2010 | Lee et al. | 714/752 |
| 7,673,223 | B2 * | 3/2010 | Richardson et al. | 714/780 |
| 7,685,497 | B2 * | 3/2010 | Kons | 714/759 |
| 8,020,078 | B2 * | 9/2011 | Richardson | 714/780 |
| 8,091,013 | B2 * | 1/2012 | Blanksby et al. | 714/786 |
| 2004/0187129 | A1 | 9/2004 | Richardson | |
| 2005/0149843 | A1 | 7/2005 | Shen et al. | |
| 2005/0229091 | A1 | 10/2005 | Narayanan et al. | |
| 2008/0028272 | A1 * | 1/2008 | Richardson | 714/752 |
| 2008/0163027 | A1 | 7/2008 | Richardson et al. | |
| 2009/0282315 | A1 * | 11/2009 | Trachewsky et al. | 714/755 |
| 2010/0153810 | A1 * | 6/2010 | Kamiya | 714/752 |

* cited by examiner

*Primary Examiner* — Joshua Lohn

(74) *Attorney, Agent, or Firm* — Deirdre Megley Kvalc; Westman, Champlin & Kelly, P.A.

(57) ABSTRACT

A decoding system for use with different degree parity constraint nodes and highly parallel processing operates by passing messages to variable nodes based on updated states of first and second check nodes, processing messages from the variable nodes and updating states of first and second check nodes in a decoder with Z processors that operate in parallel, further processing the updated state information for the second check nodes to coordinate the states of N=Z/z sets of second check nodes, where z is the number of bits associated with the second check nodes, and repeating the process utilizing the coordinated states of the second check nodes as the updated states of the second check nodes.

18 Claims, 5 Drawing Sheets

| 1 | 2 | 3 | 4 | 5 | 6 |
|---|---|---|---|---|---|

FIG. 7A

| 6 | 1 | 2 | 3 | 4 | 5 |
|---|---|---|---|---|---|

FIG. 7B

| 5 | 6 | 1 | 2 | 3 | 4 |
|---|---|---|---|---|---|

FIG. 7C

| 4 | 5 | 6 | 1 | 2 | 3 |
|---|---|---|---|---|---|

FIG. 7D

| 3 | 4 | 5 | 6 | 1 | 2 |
|---|---|---|---|---|---|

FIG. 7E

| 2 | 3 | 4 | 5 | 6 | 1 |
|---|---|---|---|---|---|

FIG. 7F

NODE PROCESSOR FOR USE WITH LOW DENSITY PARITY CHECK DECODER USING MULTIPLE VARIABLE NODE DEGREE DISTRIBUTION CODES

BACKGROUND OF THE INVENTION

The invention relates generally to node processors for low density parity check decoders.

Low density parity check (LDPC) codes are a class of linear error correction codes (ECCs) that can be decoded efficiently with iterative decoders. The decoders can be represented by Tanner graphs, in which variable nodes that correspond to code word symbols, or vectors of symbols, and parity constraint nodes that correspond to parity constraints are interconnected by edges that represent the inclusion of the code word symbols in the respective parity constraints. The LDPC codes can be referred to by variable node degree distributions, which relate to the number of edges connecting to the respective variable nodes. For example, a code may have a variable node degree distribution in which x percent of the variable nodes are degree three and 100−x percent are degree four. The degrees of the respective variable nodes in the example indicate that corresponding code word symbols are associated with three or four parity constraints. An LDPC code has a higher variable node degree distribution if it has a larger number of higher degree variable nodes.

The parity constraint nodes are also denoted by degrees, which indicate the number of code word symbols that are included in associated parity check equations. The LDPC code could instead be represented by a parity check H matrix.

When contrasted with other linear ECCs, such as Reed Solomon codes, the LDPC codes have good dB performance, that is, perform well in low signal-to-noise situations. However, the LDPCs also have relatively high error floors, or sector failure rates, that remain relatively constant even at higher signal-to-noise ratios. In the channels of interest, error floors are lower for LDPC codes that have higher degree variable nodes. There is thus a trade off involve in optimizing either for better dB performance or lower error floors. Generally, data storage systems must meet prescribed sector failure rate minimums, and the LDPC codes are selected based on their error floors. The same trade off occurs with respect to the burst error correction capabilities of the LDPC codes.

A solution to this tradeoff is a decoding system comprising an iterative decoder that is characterized by a plurality of variable nodes and a plurality of parity constraint nodes, and a processor that at respective iterations disables one or more selected parity constraint nodes to operate the iterative decoder with a selected variable node degree distribution code and at other iterations enables one or more of the selected parity constraint nodes to operate the iterative decoder with one or more higher variable node degree distribution codes, which is described in co-pending U.S. patent application Ser. No. 12/185,437 filed Aug. 4, 2008 entitled Low Density Parity Check Decoder Using Multiple Variable Node Degree Distribution Codes, which is assigned to a common Assignee and incorporated herein in its entirety by reference. The decoder works well and may operate with various codes that utilize different degree parity constraint nodes.

SUMMARY OF THE INVENTION

A decoding system for use with different degree parity constraint nodes and highly parallel processing operates by passing messages to variable nodes based on updated states of first and second check nodes, processing messages from the variable nodes and updating states of first and second check nodes in a decoder with Z processors that operate in parallel, further processing the updated state information for the second check nodes to coordinate the states of N=Z/z sets of second check nodes, where z is the number of bits associated with the second check nodes, and repeating the process utilizing the coordinated states of the second check nodes as the updated states of the second check nodes.

The decoder comprises first check nodes that are associated with a low variable degree distribution code, second check nodes that selectively operate with the first check nodes and are associated with a higher variable degree distribution code, Z node processors that operate in parallel to process messages from variable nodes and pass messages to the variable nodes from the first and second check nodes. The node processors iteratively sending messages to the variable nodes based on updated states of the first check nodes and also N=Z/z sets of the operative second check nodes where z is the number of bits associated with the operative second check nodes, iteratively updating states of the first and the operative second check nodes based on messages received from the variable nodes, further processing the updated state information of the second check nodes and coordinating the updated state information in the N sets, and using the coordinated state information as the updated states of the N sets of second check nodes.

BRIEF DESCRIPTION OF THE DRAWINGS

The invention description below refers to the accompanying drawings, of which:

FIG. 7A-F illustrate coordinating the states of simulated constraint nodes.

DETAILED DESCRIPTION OF AN ILLUSTRATIVE EMBODIMENT

Figure 1:
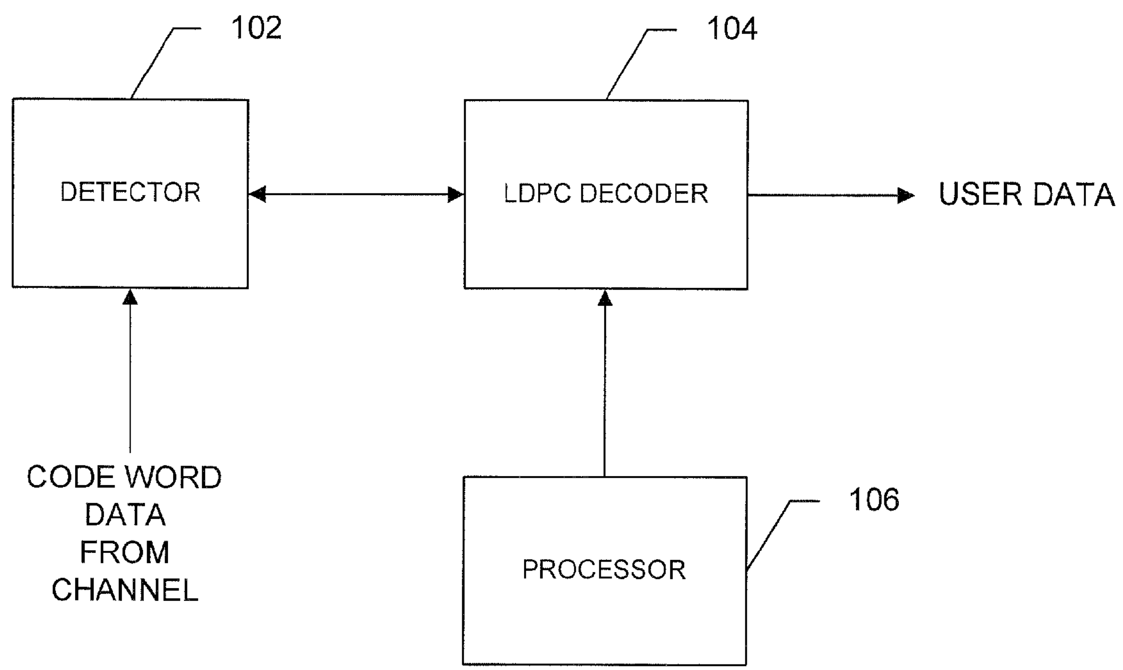
FIG. 1 is a functional block diagram of a decoding system constructed in accordance with the invention.

Referring to FIG. 1, a decoding system includes an intersymbol interference (ISI) detector 102, such as a Soft Output Viterbi detector (SOVA), and an iterative decoder 104, referred to in the drawing as an LDPC decoder. The detector 102 receives a block of code word data from a magnetic recording channel (not shown) and in a known manner provides corresponding soft information to the LDPC decoder. A system processor 106 controls the LDPC decoder to operate the decoder utilizing selected variable node degree distribution LDPC codes. As appropriate, the decoder, under the control of the system processor 106, may also utilize LDPC codes and one or more concatenated single parity codes (SPCs). For ease of understanding, the operations of the LDPC decoder and associated node processors (FIGS. 4-6) are described with reference to a system that utilizes an LDPC code and concatenated SPCs.

Figure 2:
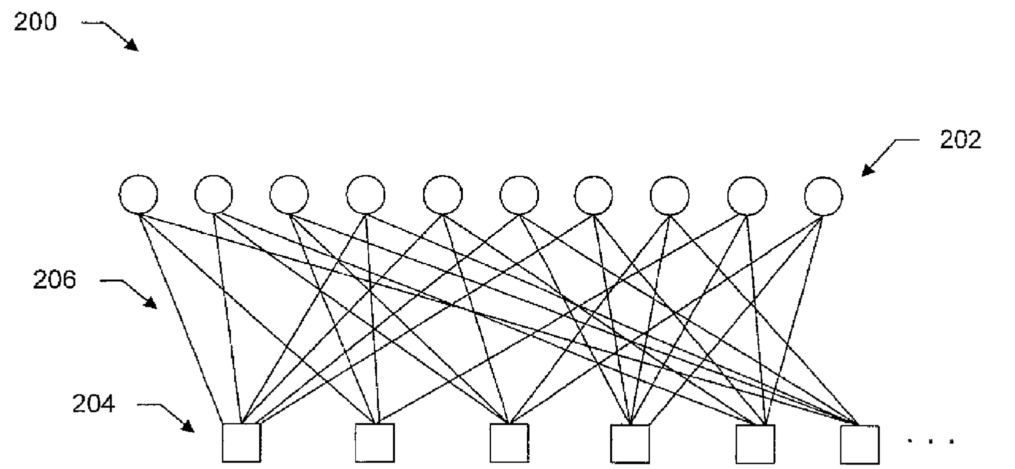
FIG. 2 is a code graph illustrating multiple variable node degree distribution codes.
Figure 3:
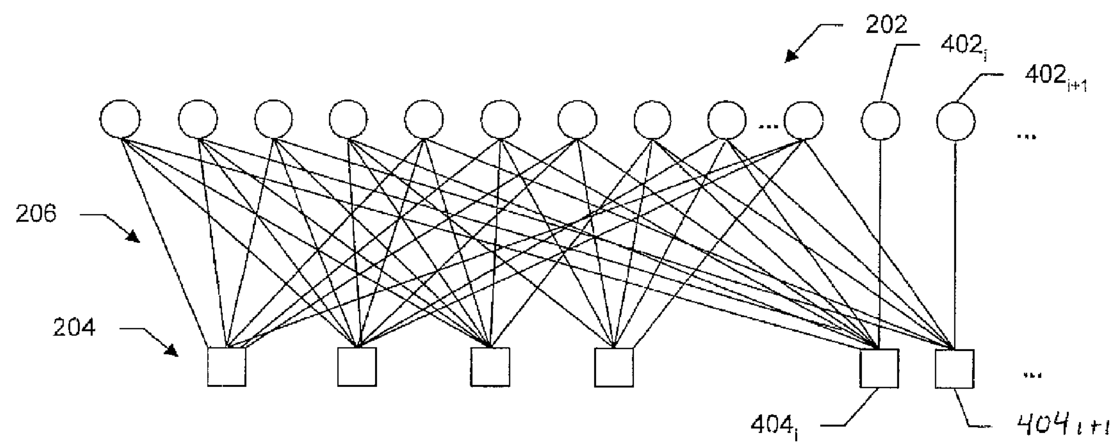
FIG. 3 is a code graph illustrating multiple variable node distribution codes consisting of LDPC and SPC codes.

Before discussing the operations of the node processors, we discuss the selectable variable node degree distribution LDPC code and concatenated SPCs. With reference also to FIGS. 2 and 3, the LDPC code utilized in the decoder 104 is depicted as a Tanner graph 200. A plurality of variable nodes 202$_i$ (collectively referred to by reference numeral 202) correspond to code word symbols, or vectors of symbols, and a plurality of constraint nodes 204$_j$ (collectively referred to by reference numeral 204) correspond to parity constraints. The variable nodes and the constraint nodes are interconnected by edges 206$_k$ (collectively referred to by reference numeral 206). As shown, the LDPC code has a variable node degree distribution in which 100 percent of the variable nodes have degree three, which is indicated by the three edges connecting to the respective variable nodes 202$_i$. The LDPC code may instead have a variable node distributions in which one or more of the variable nodes have different degrees, such as 20 percent degree four nodes and 80 percent degree three nodes, and so forth. For ease of understanding, we describe the exemplary system below in terms of an LDPC code in which the variable nodes are 100 percent degree three nodes.

As shown in FIG. 3, one or more concatenated SPCs utilize variable nodes 402 and parity constraint nodes 404. The SPC variable nodes connect only to the SPC constraint nodes, which connect also to each of the variable nodes 202, such that the respective variable nodes 202 have degree x+1 where x is the degree associated with the LDPC code, here 3+1, while the SPC variable node 402 has a degree of 1.

The SPC functions to clear the error floor, and is used in later decoder iterations as needed. Thus, the decoder operates first with the LDPC codes and disables the SPCs. Various variable node degree distribution SPCs may then be utilized, with the inclusion of appropriate numbers of additional SPC variable and parity constraint nodes 402 and 404. When more than one SPC is used, the SPCs essentially divide up the LDPC code variable nodes 202, and span the entire block of code word data. The system may utilize respective SPCs for particular decoding operations by enabling and disabling different ones of the SPC constraint nodes 404, which also disables the corresponding SPC variable nodes 402 and the corresponding edges 206 leading to the associated LDPC code variable nodes.

The LDPC decoder 104 utilizes Z node processors operating in parallel to generate and pass messages, to efficiently update the states of the variable and constraint nodes, where Z is typically on the order of 100 to 300—in the example the decoder utilizes 192 processors, which operate in parallel and processes 192 edges per clock cycle. The Tanner graph that describes the decoder has, for a 512 byte code word block, on the order of 5000 variable nodes and 700 LDPC constraint nodes. Each variable node has 3 edges for the LDPC constraint nodes and 1 edge for the SPC constraint nodes. In the example, there are z=32 SPC nodes and they essentially divide up the variable nodes, such that each SPC constraint node has on the order of 5000/32≅156 edges connected to it. In contrast, each LDPC constraint node has on the order of 20 to 25 edges connected to it.

There are 4*5000=20,000 edges to be processed to pass messages to or from the variable nodes, with 192 edges being processed per clock cycle in a time-sharing of the 192 processors. The decoder thus processes the 20,000 edges in 104 clock cycles, plus some extra clock cycles for overhead processing, with each processor processing messages on one edge per clock cycle.

Figure 4:
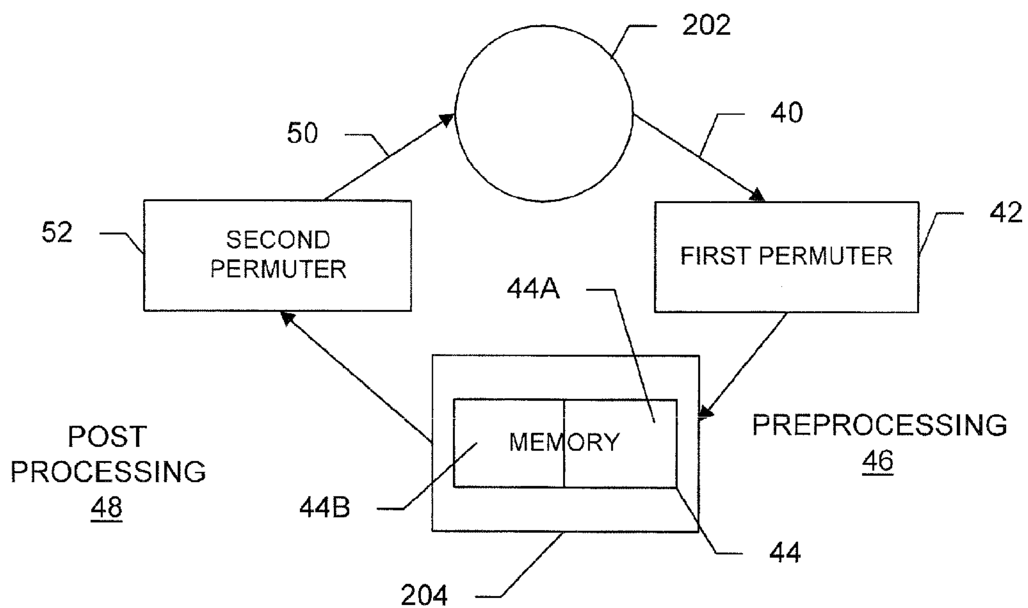
FIG. 4 is a functional block diagram of a conventional node processor.

Referring now also to FIG. 4, a conventional constraint node processor 400 includes a first permuter 42 that permutes, or shuffles, messages on a bus 40 coming from the variable nodes 202. A preprocessing sub-processor referred to generally by the reference numeral 46 determines for a given constraint node, the smallest magnitude received message on a given edge.

A post processing subprocessor referred to generally by reference numeral 48 determines the smallest magnitude message received by the node on any edge, the index of the edge over which the smallest magnitude message was received and the next smallest magnitude message, based on the values retained in the memory 44. The post processing also generates messages to send to the variable nodes 202. The messages are sent on a bus 50 after passing through a second permuter 52, which performs operations that are the compliment of the operations of the first permuter 42. Thus, if a check node 204$_i$ receives a message from a variable node 202$_k$ in message vector j, the second permuter establishes the same connection when messages are sent back to the variable nodes. The connections may be established dynamically throughout the iteration, such that if check node 204$_i$ is connected to variable node 202$_k$ during one clock cycle, then check node 204$_i$ will be connected to a different variable node 202j during the next clock cycle.

The constraint nodes 204 thus update their states based on messages from the variable nodes, and send messages to the variable nodes based on the updated states. The respective processors 400 process messages on associated edges each clock cycle. If the processors operating the SPC constraint nodes 404 process one edge per clock cycle, the SPC constraint nodes would slow down the decoder because of the 156 edges connected to each SPC constraint node versus the 20 to 25 edges connected to each LDPC constraint node. Accordingly, I have developed “super-C nodes” that simulate the SPC constraint nodes in hardware, to take advantage of the parallel processing through the Z processors. The super-C nodes provide message vectors that are processed by the Z processors operating in parallel, to simulate the z SPC high degree constraint nodes as N=Z/z sets of nodes with coordinated states. This allows use of the Z processors operating in parallel to provide the appropriate messages to the variable nodes in fewer clock cycles. The super-C nodes are discussed in more detail below with reference to FIGS. 6-9.

Before discussing the operation of the super-C nodes, the message generation operations of the variable nodes 202 and constraint nodes 204 are discussed. The variable nodes accumulate log-likelihood-ratio (“LLR”) messages from the channel detector and the constraint nodes. Each variable node returns the accumulated LLR value to a given constraint node after subtracting the LLR message received from that node. The constraint node calculates new messages for the variable nodes based on a well known belief propagation expression:

$$c2v_i = \tanh^{-1}\left(\prod_{k \neq i} \tanh(v2c_k)\right) \qquad \text{eqn. 1}$$

where $v2c_k$ are the messages sent from the variable nodes to the constraint node k and $c2v_i$ are the messages returned to the variable node i. For ease and speed of calculation, the expression is replaced by a min-approximation in which the sign of the message is given by:

$$\text{sign}(c2v_i) = \prod_{k \neq i} \text{sign}(v2c_k) \qquad \text{eqn. 2}$$

and the magnitude of the message by:

$$|c2v_i| = \min_{k \neq i} |v2c_k| \qquad \text{eqn. 3}$$

The message magnitude can be calculated based on the smallest magnitude, min $|v2c_k|$, the edge index, k, and the next smallest magnitude, $$\min_{i \neq k} |v2c_i|.$$

The message sign and magnitude are determined in post processing operations, after the messages from the variable nodes have been used to update the state of the constraint node.

Figure 5:
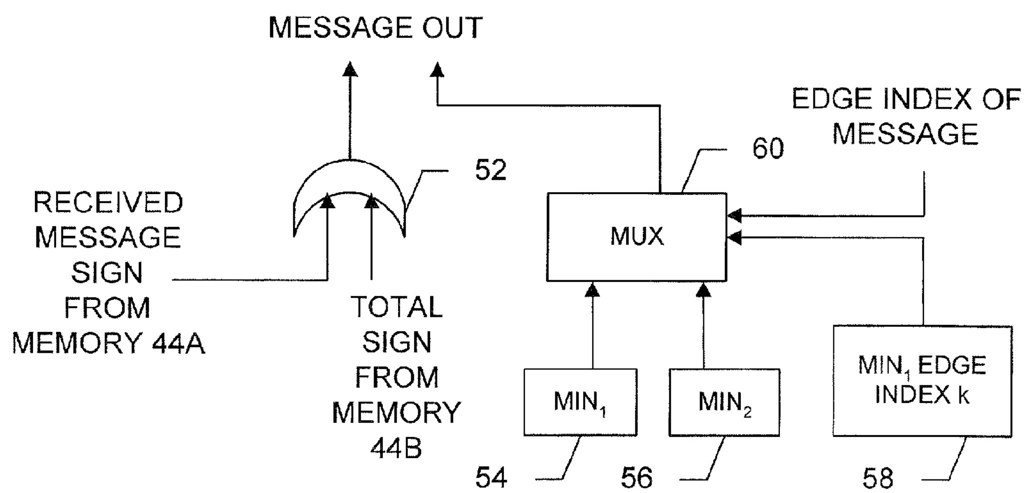
FIG. 5 is a functional block diagram of post processing performed by the node processor of FIG. 4.

Referring now to FIG. 5, for a given constraint node the sign of the message to be sent over a particular edge, that is, to a particular variable node, is calculated as the product of the signs of all incoming messages to the constraint node with the sign of the message from the particular variable node, i.e., received on the particular edge, removed.

The total sign and minimum magnitudes used to generate the messages from the constraint node are determined after the messages received from the variable nodes have been preprocessed, and the sign and minimum values for the respective edges are retained in a pre-process section 44A of the memory 44.

The post processing operations produce a total sign value as the XOR of all the sign values retained in the pre-processing memory. The total sign value is retained in a post processing section 44B of the memory 44, along with minimum magnitude values and edge index information. To produce a message, for a given variable node, the post processing removes the sign of the message received over the same edge from the total sign value and as appropriate uses the smallest or, for the edge that matches the edge index, the next smallest magnitude value.

As is known, an iteration counter (not shown) keeps track of the number of iterations to provide the edge index of the smallest magnitude message. In the example, the iteration counter counts 20 iterations for the 20 edges 206 connected to respective LDPC constraint nodes 204. The smallest magnitude value of the received messages and a next smallest magnitude value of the received messages are retained in a $\min_1$ register 54 and a $\min_2$ register 56, respectively. The edge index associated with the smallest magnitude value is retained in an index register 58. After all of the messages received from the variable nodes 202 have been processed, the contents of the registers are retained in the post processing section 44B of the memory 44. The post processing then generates messages using the post processed sign and minimum magnitude information, as set forth above in equations 2 and 3. Thus a multiplexer 60 provides the $\min_1$ value as the magnitude for the messages to all associated variable nodes except the node that is connected to the edge k, which receives the $\min_2$ value.

Figure 6:
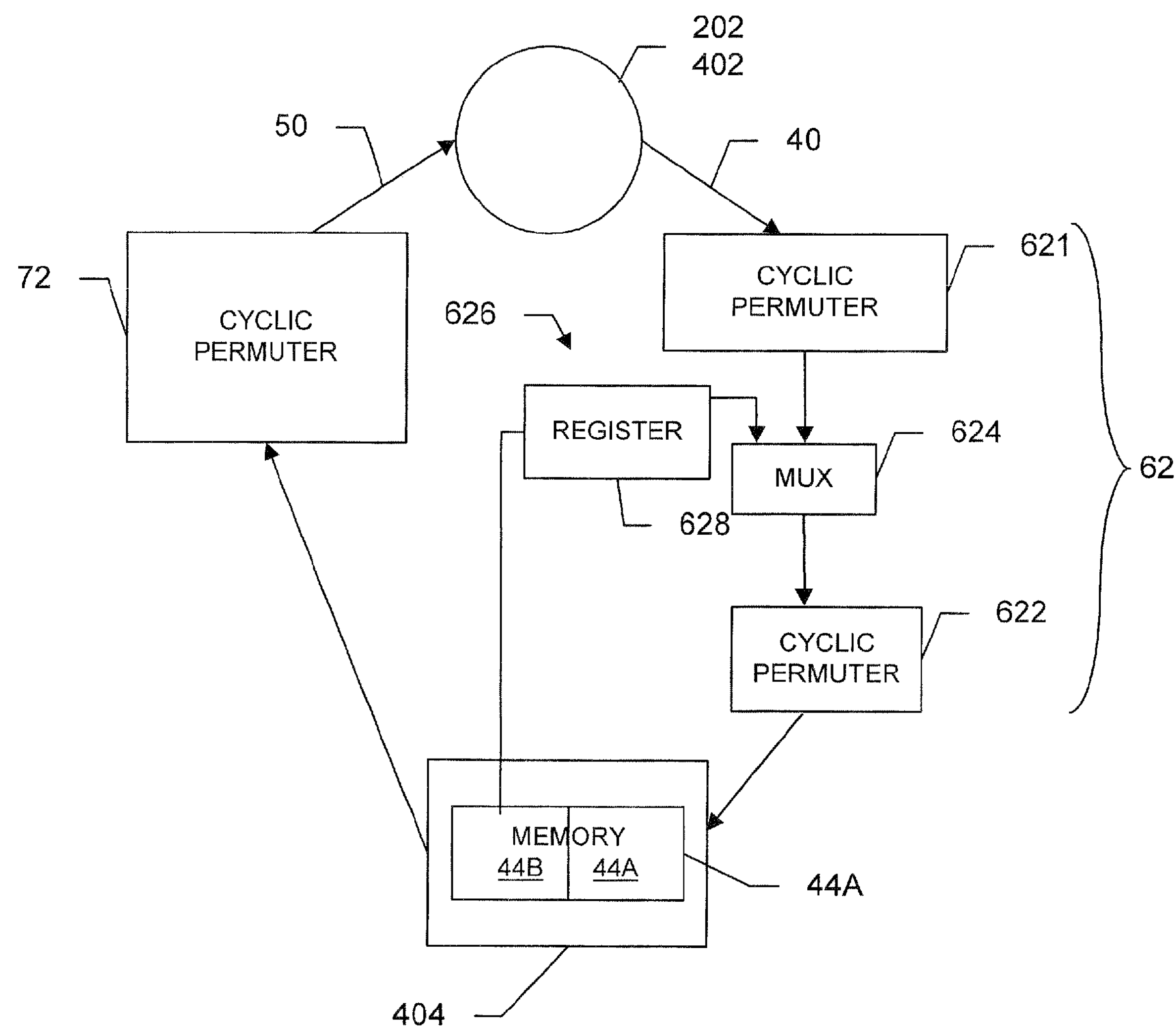
FIG. 6 is a functional block diagram of a node processor constructed in accordance with the invention.

Referring now to FIG. 6, super-C nodes 600 simulate the SPC constraint nodes 404 in hardware and coordinate the updated states of the simulated SPC constraint nodes as N=Z/z sets of SPC constraint nodes, where z is the number bits associated with the SPC codes, i.e., the number of then operative SPC nodes. The decoder uses the coordinated updated states of the N sets of simulated SPC constraint nodes to generate messages for the variable nodes, utilizing the parallel processing of the Z processors.

There are z super-C nodes 600, and each one simulates Z/z or N SPC constraint nodes. Each super-C node includes a first SPC permuter 62 that operates in two stages 621 and 622. The two stages together perform the permutations that correspond to a first SPC node, and the second state operating alone performs permutations that coordinate the states of the N sets of nodes, as discussed in more detail below.

The messages received from the variable nodes are permuted by the first stage 621 of the first SPC permuter and passed by the multiplexer 624 to the second stage 622, with the second stage providing additional permutation, as appropriate. The preprocessing sub-processor 46 provides updated sign and minimum magnitude values for the respective edges in the usual manner, and these values are retained in the preprocessing section 44A of the memory 44. The post processing subprocessor 48 produces the total sign, minimum magnitude information and the edge index for the first of the N SPC constraint nodes that are simulated in the super-C node. The post processing provides the $\min_1$, $\min_2$ and k values to associated registers 54, 56 and 58 in the post-processing memory 44B.

The post processing sub-processor 48 also provides the total sign and minimum magnitude values to a feed forward path 626. The path leads through the multiplexer 624 to the second stage 622 of the SPC permuter 62, which treats the sign and magnitude information as a received message vector for the corresponding SPC constraint node in the adjacent set. A register 628 is included to capture the information at the appropriate time for processing.

Figures 7A, 7B, 7C, 7D, 7E, 7F:
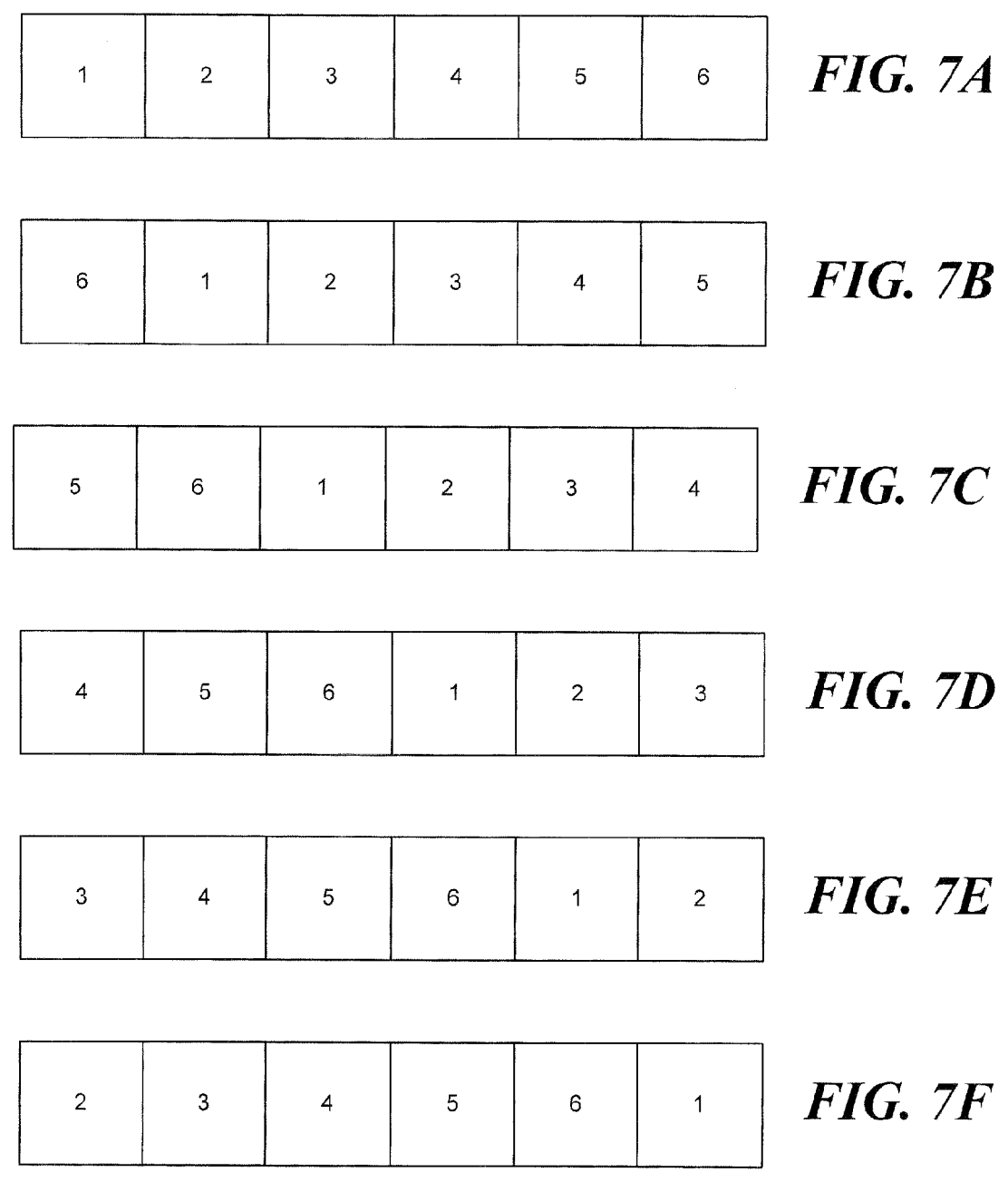

The second stage 622 of the SPC permuter 62 permutes the information by shifting the information by z positions such that the updated $\min_1$ and total sign values are cyclically shifted to be combined with the corresponding node in the next of the N sets of simulated SPC constraint nodes. For example, the information from node 1 (set 1) is combined with node 33, which is the first node in the second set. Similarly, the information from the first node in set N is cyclically shifted by 32 to be combined with the information of the first node in set 1. This is illustrated in FIGS. 7A-B, where 7A represents the states after the messages from the variable nodes have been preprocessed.

The extra iterations utilize preprocessing operations that are performed in the usual manner, treating the information on the feed forward path 626 as a received message vector. The iteration counter (not shown) also continues its iterations, with the edge count extending beyond the count associated with the actual SPC constraint nodes. The feed forward path is repeatedly utilized until each of the sets of simulated SPC nodes have coordinated updated states, and thus, N−1 permutations are performed for the extra preprocessing required to coordinate the states of all N sets, as is illustrated in FIGS. 7A-F.

With the iteration counter continuing its count during each of the N extra iterations, only one of the N sets has an edge index that is applicable, and thus, the $\min_2$ value will be sent out only once per variable node. The states of the simulated nodes in each set are otherwise identical.

The coordinated updated states of the simulated Z SPC nodes are then used to process and send messages to the variable nodes. The decoder can thus utilize the Z processors in parallel to generate and send the messages, to minimize the overall processing time. The message processed from corresponding nodes in each set can be sent over the appropriate edges to the variable nodes,-by mapping the respective edges to the different sets.

The feed forward path has a shorter latency then the path through the post processor to the variable node and back. Accordingly, coordinating the updated states of the N sets of simulated SPC constraint nodes does not significantly delay system operations.

The connections between the variable nodes and constraint nodes are defined by fields such as permutation value and constraint node index value. Accordingly, the connections can be properly made to and from the Z simulated nodes and the variable nodes through the first and second SPC permuters 62 and 72. The additional hardware, that is, the feedforward path, required for the super-C nodes is minimal, in particular because the nodes utilize the same preprocessing operations for the N−1 extra iterations.

The processors or functions described herein can be implemented in software, firmware and/or hardware. The respective processors or functions may be performed by individual processors or groups of processors. Further, the processors or functions described or depicted separately may be combined in one or more processors or functions. Also, the codes described as one or more SPCs may be other codes that in combination with the LDPC code or codes result in higher density codes.

What is claimed is:

1. A method of decoding a data block comprising processing messages from variable nodes corresponding to the block of data and updating states of Z first check nodes and z second check nodes with Z processors included in one or more hardware components where z corresponds to z bits associated with the z second check nodes and Z corresponds to a number of processors that operate in parallel where Z is greater than z; and providing messages to the variable nodes based upon the updated states of the Z first check nodes and the z second check nodes.

2. The method of claim 1 wherein the second check nodes in combination with the first check nodes are associated with a higher variable node degree distribution code than the first check nodes operating without the second check nodes.

3. The method of claim 2 wherein the first check nodes are associated with a low density parity check code.

4. The method of claim 3 wherein the second check nodes are associated with one or more single parity check codes.

5. A decoder comprising first check nodes and z second check nodes that are associated with a variable degree distribution code;

Z node processors included in one or more hardware components and configured as z sets of N first check node processors and z second check node processsors where z corresponds to a number of bits associated with the second check code, Z corresponds to a number of processors that operate in parallel, and N corresponds to Z/z, wherein the Z node processors are configured to process messages directed to and from variable nodes and update states of the z sets of N first check nodes based upon the messages received from the variable nodes, and further update the states of the z second check nodes utilizing the z sets of N first check node processors and the z second check node processors.

6. The decoder of claim 5 wherein the decoder includes a processing loop including a feed forward subsystem that includes a permutation processor subsystem that permutes the updated states for the z sets of N first check node processors and the z second node processors, and a preprocessor that processes the permuted updated state for the z sets of N first check nodes to update the states of the z second check nodes.

7. The decoder of claim 6 further including a post processor that post processes the updated states of the z second check nodes and generates messages to be sent to the variable nodes; and a memory for retaining preprocessed information and post processed information.

8. The decoder of claim 6 wherein the permutation subsystem consists of cascaded permuters, with the permutation subsystem configured to shift the preprocessed information for N processing nodes of the z sets of N first check nodes.

9. The decoder of claim 5 wherein the first check nodes operate as a low density parity check code.

10. The decoder of claim 9 wherein the second check nodes operate as single parity check nodes.

11. The decoder of claim 10 wherein the second check nodes have higher degrees than the first check nodes.

12. A system comprising a preprocessor included in one or more hardware components for updating state information for Z check nodes based on received messages from variable nodes;

a feed forward path for providing the updated state information for the preprocesseed Z check nodes to the preprocessor as received messages; and the preprocessor configured to further process the Z check nodes to coordinate the updated state of first of N processing nodes and subsequent of the N processing nodes of z sets of N check nodes, where N corresponds to Z/z, utilizing the updated state information from the feed forward path; and using the updated state information to update the state of z second check nodes to produce messages for sending to the variable nodes.

13. The system of claim 12 further including in the feed forward path a permutation processor subsystem that permutes the updated state information for the first of the N processing nodes and the subsequent of the N processing nodes of the z sets of N check nodes.

14. The system of claim 13 wherein the system determines for the z sets of N check nodes a smallest message magnitude and a next smallest message magnitude and an edge index as the updated state information.

15. The system of claim 14 wherein the system further determines a total sign value as the updated state information.

16. The system of claim 15 wherein the system provides to the feed forward path the smallest message magnitude and the total sign value.

17. The system of claim 12 wherein the z sets of N check nodes are high degree nodes.

18. The system of claim 17 configured to process nodes of lesser degrees that do not utilize the feed forward path.

* * * * *